United States Patent
Baade et al.

(10) Patent No.: US 10,074,619 B2
(45) Date of Patent: Sep. 11, 2018

(54) OPTOELECTRONIC COMPONENT DEVICE AND METHOD FOR PRODUCING AN OPTOELECTRONIC COMPONENT DEVICE

(71) Applicant: OSRAM Opto Semiconductors GmbH, Regensburg (DE)

(72) Inventors: Torsten Baade, Regensburg (DE); Jörg Erich Sorg, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 14/401,757

(22) PCT Filed: May 23, 2013

(86) PCT No.: PCT/EP2013/060617
§ 371 (c)(1),
(2) Date: Mar. 26, 2015

(87) PCT Pub. No.: WO2013/174919
PCT Pub. Date: Nov. 28, 2013

(65) Prior Publication Data
US 2015/0255693 A1    Sep. 10, 2015

(30) Foreign Application Priority Data

May 24, 2012 (DE) .................. 10 2012 208 730

(51) Int. Cl.
*H01L 23/60* (2006.01)
*H02H 3/20* (2006.01)
(Continued)

(52) U.S. Cl.
CPC .............. *H01L 23/60* (2013.01); *H01L 23/58* (2013.01); *H01L 27/0296* (2013.01);
(Continued)

(58) Field of Classification Search
CPC ..... H01L 23/60; H01L 33/62; H01L 27/0288; H01L 27/0296; H02H 1/00; H02H 1/0007;
(Continued)

(56) References Cited

U.S. PATENT DOCUMENTS

| 4,891,730 A | 1/1990 | Saddow et al. |
| 5,068,868 A * | 11/1991 | Deppe ................ H01S 5/18361 257/11 |

(Continued)

FOREIGN PATENT DOCUMENTS

| DE | 10 2008 054 506 | 6/2010 |
| DE | 10 2010 025 887 | 7/2010 |

(Continued)

*Primary Examiner* — Eduardo A Rodela
(74) *Attorney, Agent, or Firm* — DLA Piper LLP (US)

(57) ABSTRACT

An optoelectronic component device includes first and second electrodes; a first optoelectronic component electrically coupled to the first and second electrodes; and a first electrically conductive section electrically coupled to the first electrode, and a second electrically conductive section electrically coupled to the second electrode; wherein the first and second electrically conductive sections are arranged electrically in parallel with the first optoelectronic component; wherein the first and second electrically conductive sections are arranged and configured relative to one another such that, beyond a response voltage applied over the first and second conductive sections, a discharge path is formed between the first and second conductive sections; and wherein the response voltage has as its value a value formed greater than the threshold voltage value of the first optoelectronic component and less than or equal to the value of the breakdown voltage of the first optoelectronic component.

5 Claims, 8 Drawing Sheets

(51) Int. Cl.
*H02H 1/00* (2006.01)
*H01L 23/58* (2006.01)
*H01L 27/02* (2006.01)
*H01L 33/62* (2010.01)
*H01L 33/40* (2010.01)
*H01L 33/52* (2010.01)
*H01L 33/48* (2010.01)
*H05K 1/02* (2006.01)
*H01T 1/12* (2006.01)

(52) U.S. Cl.
CPC ............. *H01L 33/40* (2013.01); *H01L 33/52* (2013.01); *H01L 33/62* (2013.01); *H02H 1/00* (2013.01); *H02H 1/0007* (2013.01); *H02H 3/20* (2013.01); *H02H 3/205* (2013.01); *H01L 33/48* (2013.01); *H01L 2224/48465* (2013.01); *H01L 2933/0016* (2013.01); *H01L 2933/0033* (2013.01); *H01L 2933/0066* (2013.01); *H01T 1/12* (2013.01); *H05K 1/026* (2013.01); *H05K 2201/10106* (2013.01)

(58) Field of Classification Search
CPC .... H02H 1/0015; H02H 1/0023; H02H 1/003; H02H 3/20; H02H 3/205; H01T 4/00; H01T 4/04; H01T 4/06; H01T 4/08; H01T 4/10; H01T 4/12
See application file for complete search history.

(56) References Cited

U.S. PATENT DOCUMENTS

| | | | | |
|---|---|---|---|---|
| 6,002,569 | A | * | 12/1999 | Horvath .................... H01T 4/08 361/111 |
| 6,054,716 | A | * | 4/2000 | Sonobe ................. H01L 25/167 250/552 |
| 6,172,590 | B1 | | 1/2001 | Shrier et al. |
| 9,768,091 | B2 | * | 9/2017 | Aripin ................. H01L 23/3107 |
| 2004/0063294 | A1 | * | 4/2004 | Durocher ................ B29C 59/14 438/382 |
| 2005/0146821 | A1 | | 7/2005 | Fjelstad et al. |
| 2005/0242415 | A1 | | 11/2005 | Abraham |
| 2006/0002047 | A1 | * | 1/2006 | Cheung .................... H01T 21/00 361/118 |
| 2006/0152334 | A1 | | 7/2006 | Maercklein et al. |
| 2006/0250733 | A1 | * | 11/2006 | Hopkins .................. H02H 9/06 361/56 |
| 2007/0216015 | A1 | | 9/2007 | Schnitt et al. |
| 2008/0023711 | A1 | * | 1/2008 | Tarsa .................... H01L 33/486 257/98 |
| 2008/0157337 | A1 | | 7/2008 | Chen et al. |
| 2008/0169480 | A1 | | 7/2008 | Weng et al. |
| 2012/0006583 | A1 | | 1/2012 | Ishihara et al. |

FOREIGN PATENT DOCUMENTS

| | | |
|---|---|---|
| JP | 5-67851 | 3/1993 |
| WO | 03/088356 | 10/2003 |
| WO | 2012/000697 | 1/2012 |

* cited by examiner

Fig 4

| Distanz der Elektroden: [μm] | Material zwischen den Elektroden | | | | |
|---|---|---|---|---|---|
| | Luft (Minimum) [ V ] | Luft (Maximum) [ V ] | PPA [ V ] | Epoxy [ V ] | Keramik [ V ] |
| 10000 | 9000 | 33000 | 165000 | 200000 | 135000 |
| 5000 | 4500 | 16500 | 82500 | 100000 | 67500 |
| 1000 | 900 | 3300 | 16500 | 20000 | 13500 |
| 500 | 450 | 1650 | 8250 | 10000 | 6750 |
| 100 | 90 | 330 | 1650 | 2000 | 1350 |
| 50 | 45 | 165 | 825 | 1000 | 675 |
| 10 | 9 | 33 | 165 | 200 | 135 |
| 5 | 4,5 | 16,5 | 82,5 | 100 | 67,5 |

OPTOELECTRONIC COMPONENT DEVICE AND METHOD FOR PRODUCING AN OPTOELECTRONIC COMPONENT DEVICE

TECHNICAL FIELD

This disclosure relates to an optoelectronic component device and a method of producing an optoelectronic component device.

BACKGROUND

Some applications in which light-emitting diodes (LEDs) are used require components which react insensitively to electrostatic discharges (ESDs). Newer high-efficiency chip technologies with light-emitting diodes, however, often have a relatively large sensitivity to ESDs, for example InGaN or GaN diodes, in which case the electrostatic discharges can lead to breakdown of the pn junction with irreversible damage. This means that the maximum voltage peak which may occur in the event of an ESD is becoming more important for newer chip technologies.

To be able to process such components, it is necessary to ensure processing in an ESD-free environment, which can entail high costs to equip the production lines. For reasons of costs for processors of electronic components, retrofitting of processing lines to produce an ESD-free environment can only be envisioned in exceptional cases.

In another conventional approach for the protection of an optoelectronic component with respect to electrostatic discharges, a back-to-back diode or an Li diode may, for example, be provided, which is formed with an orientation antiparallel to the forward-bias direction of the optoelectronic component. In this way, an ESD event can always be dissipated via the diode connected in the forward direction as a function of its polarity, i.e. either the ESD protection diode or the optoelectronic component. Abrupt discharges at a diode connected in the reverse-bias direction can be avoided in this way.

In another conventional approach for the protection of an optoelectronic component with respect to electrostatic discharges, a series resistor, for example, with a resistance of 330 ohms (Human Body Model HBM), may be connected in front of the optoelectronic component to be protected. With the aforementioned conventional approaches, the ESD-sensitive component to be protected can achieve an ESD stability which corresponds to that of components with conventional chip technology. Nevertheless, the maximum voltage peak of the ESD pulse may be limited in these conventional approaches since very high electric fields can nevertheless cause damage at the active layers of the ESD protection diode, as well as at the optoelectronic component.

Furthermore, these ESD protection components require an area, for example, of at least 200×200 $\mu m^2$, which is lost in the miniaturization of the actual optoelectronic component to be protected. At the same time, the ESD protection component may absorb light which is emitted, for example, by an optoelectronic component to be protected and, therefore, reduce the efficiency of the optoelectronic component to be protected.

DE 10 2012 208 730.3, the subject matter of which is incorporated herein, describes an optoelectronic component device and a method of producing an optoelectronic component device.

We provide an optoelectronic component device and a method of producing an optoelectronic component device, wherein the component device saves on costs and the area for an additional ESD protection diode.

An organic material is a carbon compound existing in chemically uniform form and distinguished by characteristic physical and chemical properties, irrespective of the respective aggregate state. Furthermore, an inorganic material is a compound without carbon or a simple carbon compound, existing in chemically uniform form and distinguished by characteristic physical and chemical properties, irrespective of the respective aggregate state. An organic-inorganic material (hybrid substance) is a compound comprising compound parts which contain carbon and compound parts which are free of carbon, existing in chemically uniform form and distinguished by characteristic physical and chemical properties, irrespective of the respective aggregate state. The term "material" comprises all materials mentioned above, for example, an organic material, an inorganic material and/or a hybrid material. Furthermore, a material mixture may for instance consist of constituents of two or more different materials, the constituents of which are, for example, very finely distributed. A material class is a material or a material mixture consisting of one or more organic material(s), one or more inorganic material(s) or one or more hybrid material(s). The term "substance" may be used synonymously with the term "material".

Our optoelectronic component device may comprise: a first electrode and a second electrode, a first optoelectronic component electrically coupled to the first electrode and the second electrode; and a first electrically conductive section electrically coupled to the first electrode, and a second electrically conductive section electrically coupled to the second electrode; wherein the first electrically conductive section and the second electrically conductive section is arranged electrically in parallel with the first optoelectronic component; and wherein the first electrically conductive section and the second electrically conductive section are arranged, and configured relative to one another, such that, beyond a response voltage applied over the first conductive section and the second conductive section, a spark discharge occurs between the first conductive section and the second conductive section; wherein the response voltage has as its value a value which is formed greater than the threshold voltage value of the first optoelectronic component and less than or equal to the value of the breakdown voltage of the first optoelectronic component.

The actual response voltage of the spark gap for a component device may be dependent on the specific configuration of the electrically conductive sections and the dielectric between the electrically conductive sections so that a voltage range within which a spark discharge occurs between the electrically conductive sections at a particular spacing is often specified. For a spark gap, the typical breakdown strength of air as a dielectric may have a response voltage in a range of from approximately 1 kV/mm to approximately 3 kV/mm. In electrically conductive sections having a spacing of 1 mm, a spark can cross over, and a discharge can therefore take place when the potential difference between the electrically conductive sections has a value greater than approximately 3 kV. At the latest beyond this potential difference, the electrical resistance may be very small compared to the resistance of the optoelectronic component in the reverse-bias direction, for example, from approximately 0Ω to approximately 500Ω. Below approximately 1 kV, on the other hand, with a spacing of 1 mm and plane-parallel electrically conductive sections, a discharge is not to be expected.

For other dielectrics, the response voltage may be formed other than in air. With a constant spacing, the response voltage of the discharge path can be modified by the choice of the dielectric.

The electrically conductive terminals should be configured such that the value of the response voltage of the discharge path is formed between the threshold voltage of the electronic component to be protected and the breakdown voltage of the electronic component.

Up to the minimum value of the response voltage of the spark gap, the optoelectronic component should be able to operate regularly without a spark, i.e., a spark discharge, being formed between the electrically conductive terminals. A typical value of a threshold voltage of an optoelectronic component, for example, a GaN diode, may be formed from approximately 0 V to approximately 5 V. Below the response voltage, the spark gap may have a resistance which is as high as possible, for example, from approximately 1 MΩ to approximately 1 GΩ, and a small flow of current, for example, from approximately 10 µA to approximately 100 µA. The response voltage of the spark gap, i.e., the voltage which is necessary to form a spark discharge between the first electrically conductive section and the second electrically conductive section, therefore has at least a voltage value greater than the value of the threshold voltage of the optoelectronic component.

The voltage value of the discharge path, beyond which a spark discharge is formed, at the latest, i.e. the maximum response voltage of the discharge path at which the breakdown of the potential difference takes place should be formed below the breakdown voltage of the optoelectronic component since otherwise protection of the optoelectronic component against electrostatic discharges cannot be ensured. A typical breakdown voltage for such a component may, for example, be formed from approximately 170 V to approximately 200 V.

One configuration of the electrically conductive sections, which satisfy these conditions may, for example, have a spacing with a value of approximately 50 µm and an air dielectric. This configuration has the advantage that it can be produced, or configured, simply in terms of process technology.

In another configuration, the first electrode may comprise a different substrate and/or a different material than the second electrode, in which case a common substrate may also be understood as a common carrier.

In another configuration, the first electrode may be formed in a plane with the second electrode.

In another configuration, the first electrode may be formed in a different plane than the second electrode.

In another configuration, the first electrode or the second electrode may be grounded.

In another configuration, the optoelectronic component may be configured as an electromagnetic radiation-emitting component, for example, a light-emitting diode, a laser diode or a solar cell.

In another configuration, the optoelectronic component may be formed within an area of approximately 25 $mm^2$, for example, in an area of approximately 1 $mm^2$, for example, in an area of approximately 0.25 $mm^2$, for example, in an area of approximately 0.09 $mm^2$, for example, in an area of approximately 0.04 $mm^2$, for example, in an area of approximately 0.01 $mm^2$, for example, in an area of approximately $25 \times 10^{-3}$ $mm^2$, for example, in an area of approximately $25 \times 10^{-6}$ $mm^2$. The electronic component may in this case have a geometrical shape, for example, from the group of geometrical shapes: rectangular, square, hexagonal, polygonal or round.

In another configuration, the optoelectronic component may be formed on or over a lead frame, in which case the first electrically conductive section and/or the second electrically conductive section may be formed as part of the lead frame.

A lead frame may, for example, be understood as a metal structure which comprise one or more metal pieces and, for example, holds the metal pieces together by a metal frame. A lead frame may, for example, be formed by a flat metal plate, for example, by a chemical method, for example, etching, or by a mechanical method, for example, stamping. A lead frame may, for example, comprise a metal frame having a multiplicity of metal pieces subsequently forming electrodes which may be connected to one another and to the metal frame by metal webs. However, a lead frame may also be understood as the metal pieces formed by a metal frame as described above, which form electrodes, the metal pieces no longer being physically connected to one another by the metal, i.e., for example, after the metal webs have already been removed. The electrodes may therefore clearly form the lead frame itself or constitute separated parts of a lead frame.

A lead frame may in this case be understood as a conduction plane and/or metallization plane, in which case the conduction plane and/or metallization plane may even only be virtually, i.e. logistically, continuous, for example, as separated electrodes which geometrically lie on a plane and are formed to supply a component with electricity.

In another configuration, the optoelectronic component may be enclosed by a housing, in which case the housing may be formed as a package.

In another configuration, the first electrically conductive section and/or the second electrically conductive section may be formed inside the package.

In another configuration, the first electrically conductive section and/or the second electrically conductive section may be formed outside the package.

In another configuration, the first electrically conductive section may be formed as a region of the first electrode, and/or the second electrically conductive section may be formed as a region of the second electrode.

In another configuration, the optoelectronic component may comprise contacting, i.e. an electrical supply, from the group of contact arrangements: top contact, for example, a sapphire chip; bottom contact, for example, a flip chip; vertical contact, for example, a diode, the top contact and the bottom contact having a two-dimensional electrical supply configuration.

In another configuration, the device may furthermore comprise at least one further optoelectronic component, the further optoelectronic component being electrically connected in parallel with the first optoelectronic component, with the first electrically conductive section and the second electrically conductive section, for example, as a "multi-die light engine".

In another configuration, the first electrically conductive section may comprise a different material than the second electrically conductive section and/or the first electrode and/or the second electrode.

In another configuration, the first electrically conductive section may be formed oriented relative to the second electrically conductive section, for example complementarily, perpendicularly, parallel, concentrically or diverging. A diverging orientation of the electrically conductive sections may, for example, be configured as a horn curve and/or Jacob's ladder. In this way, the spark discharge can be quenched when the voltage falls below the response voltage.

In one configuration, the electrically conductive sections may have a mutually complementary arrangement, in which case the first electrically conductive section may be formed partially and/or fully perpendicularly and/or parallel to the second electrically conductive section.

In one configuration, the electrically conductive sections may have an overlapping arrangement, i.e. an arrangement offset with respect to one another and/or an arrangement displaced with respect to one another, in which case parts of the electrically conductive sections may be mutually parallel, for example, at a distance from one another. The electrically conductive sections may also be formed in different planes in the sense of the plane of the drawing, for example, in a similar way to a cross.

In one configuration, a parallel arrangement of the electrically conductive sections may, for example, be formed as a partially and/or fully concentric arrangement and/or coaxial arrangement of the electrically conductive sections.

The second electrically conductive section may in this case form the inner electrically conductive region of a concentric arrangement of electrically conductive sections, in which case the interior of the second electrically conductive section may, for example, be hollow or may, for example, comprise an electrically insulating material or, for example, the same material, a similar material or a different electrically conductive material than the first electrically conductive section.

In another configuration, the surface of the first electrically conductive section and/or the surface of the second electrically conductive section, between which the discharge path is formed, may have a surface geometry from the group of geometrical shapes: flat, round, rough, acute and/or mutually complementary.

The surfaces of the electrically conductive sections, for example, between which the discharge path are formed, may also locally and/or globally have combinations of individual geometrical shapes with one another.

The geometrical shapes may be configured regularly in such a way that they have a geometrical symmetry axis, in which case the symmetry axis may have mirror symmetry and/or additionally rotational symmetry.

The electrically conductive sections may, for example, have a planar shape or a tapering shape.

A surface of electrically conductive sections may, for example, be formed in a similar way to a rod or pin, or be formed in a similar way to a planar plane.

Electrically conductive sections with a tapering shape may, for example, be formed in a similar way to a point or in a similar way to a rounding. With the tapering shape, the minimum value of the response voltage can be reduced, since the tapering shapes can locally have a higher field strength than planar shapes.

The surface may however also be partially or fully arbitrarily shaped, for example, by roughness or a coarse manufacturing process, for example, when the difference between the breakdown voltage of the electronic component and the threshold voltage of the electronic component is very great, for example, more than 200 V.

In another configuration, the shortest distance between the first electrically conductive section and the second electrically conductive section, between which the discharge path is formed, may have a value of from approximately 1 µm to approximately 100 µm.

In another configuration, the first electrically conductive section and the second electrically conductive section may be surrounded by encapsulation, for example, enclosed in a cavity, may be part of a section plane of a carrier of the optoelectronic component, or may be surrounded by a casting material which comprises, for example, an electrically insulating, crosslinkable organic and/or inorganic compound, for example, an epoxy resin or a silicone.

The encapsulation may be formed as mechanical protection for the electrically conductive sections such that the distance between the surfaces of the electrically conductive sections and the shape of the surfaces of the electrically conductive sections are protected in respect of external actions of force, for example, a collision, impact, falling or bending, against changes, for example, an increase or decrease in the distance or a deformation of the surface of the electrically conductive sections.

In another configuration, the encapsulation may be configured such that the dielectric, for example, air, is protected against environmental influences, for example, a change in the air humidity and/or an incidence of ionizing radiation, for example, UV radiation, X-radiation. These environmental influences could modify the necessary voltage which should be applied via the electrically conductive sections, in such a way that the formation of a spark discharge are formed at a value of the applied voltage which takes place below the threshold voltage of the electronic component to be protected, or above the breakdown voltage of the electronic component to be protected, and can compromise the function of the component to be protected or the ESD protection.

In another configuration, the material between the first electrically conductive section and the second electrically conductive section may comprise a material, or be formed therefrom, from the group of materials of electrically insulating, crosslinkable organic and/or inorganic compound, for example, an epoxy resin, a silicone or a ceramic.

In another configuration, the material between the first electrically conductive section and the second electrically conductive section may comprise a vacuum, or a gas, or be formed therefrom, from the group of gases, for example, oxygen, carbon dioxide, nitrogen, ozone or a noble gas.

In another configuration, the optoelectronic component device may be configured such that the optoelectronic component is protected against electrostatic discharges in the reverse-bias direction.

A method of producing an optoelectronic component device is provided, the method may comprise: formation of a first electrically conductive section electrically coupled to a first electrode, and of a second electrically conductive section electrically coupled to a second electrode; and coupling of a first optoelectronic component to the first electrode and to the second electrode; wherein the first optoelectronic component connects electrically in parallel with the first electrically conductive section and the second electrically conductive section; and wherein the first electrically conductive section and the second electrically conductive section are arranged, and configured relative to one another such that, beyond a response voltage applied over the first conductive section and the second conductive section, a spark discharge occurs between the first conductive section and the second conductive section; wherein the response voltage has as its value a value which is formed greater than the threshold voltage value of the first optoelectronic component and less than or equal to the value of the breakdown voltage of the first optoelectronic component.

In one configuration of the method, the first electrode may comprise a different material and/or a different substrate than the second electrode.

In another configuration of the method, the first electrode may be formed in a plane with the second electrode.

In another configuration of the method, the first electrode may be formed in a different plane than the second electrode.

In another configuration of the method, the first electrode or the second electrode may be formed to be grounded.

In another configuration of the method, the optoelectronic component may be configured as an electromagnetic radiation-emitting component, for example, a light-emitting diode, a laser diode or a solar cell.

In another configuration of the method, the optoelectronic component may have an external dimension of up to approximately 1000×1000 μl m$^2$, for example, approximately 300×300 μm$^2$, for example, approximately 250×250 m$^2$.

In another configuration of the method, the optoelectronic component may be formed on or over a lead frame, the first electrically conductive section and/or the second electrically conductive section being formed as part of the lead frame.

In another configuration of the method, the optoelectronic component may be formed to be enclosed by a package.

In another configuration of the method, the first electrically conductive section and/or the second electrically conductive section may be formed inside the package.

In another configuration of the method, the first electrically conductive section and/or the second electrically conductive section may be formed outside the package.

In another configuration of the method, the first electrically conductive section may be formed as a region of the first electrode, and/or the second electrically conductive section may be formed as a region of the second electrode.

In another configuration of the method, the optoelectronic component may comprise contacting from the group of contact arrangements: top contact, for example, a sapphire chip; bottom contact, for example, a flip chip; vertical contact, for example, a diode, the top contact and the bottom contact having a two-dimensional electrical supply configuration.

In another configuration of the method, the device may furthermore comprise the coupling of at least one further optoelectronic component, the further optoelectronic component being electrically connected, or coupled, in parallel with the first optoelectronic component, with the first electrically conductive section and the second electrically conductive section.

In another configuration of the method, the first electrically conductive section may comprise a different material and/or a different substrate than the second electrically conductive section.

In another configuration of the method, the first electrically conductive section may be formed oriented relative to the second electrically conductive section in a perpendicular, parallel, concentric or diverging manner.

In another configuration of the method, the surface of the first electrically conductive section and/or the surface of the second electrically conductive section, between which the spark discharge occurs may be configured such that the surface has a surface geometry from the group of geometrical shapes: flat, round, rough, acutely tapering and/or mutually complementary.

In another configuration of the method, the first electrically conductive section may be formed with respect to the second electrically conductive section such that the shortest distance between the first electrically conductive section and the second electrically conductive section, between which the discharge path is formed, has a value of from approximately 1 μm to approximately 100 μm.

In another configuration of the method, an encapsulation is formed around the first electrically conductive section and the second electrically conductive section.

In another configuration of the method, the material between the first electrically conductive section and the second electrically conductive section may comprise a material, or be formed therefrom from the group of materials of electrically insulating, crosslinkable organic and/or inorganic compound, for example an epoxy resin, a silicone, a ceramic or a gas, for example, air, or a vacuum.

In another configuration of the method, the optoelectronic component device may be configured such that the optoelectronic component is protected against electrostatic discharges in the reverse-bias direction.

BRIEF DESCRIPTION OF THE DRAWINGS

FIG. 4 shows an overview of response voltages according to various examples.

DETAILED DESCRIPTION

In the following detailed description, reference is made to the appended drawings, which form part of this description and in which specific examples in which our devices and methods may be implemented are shown for illustration. In this regard, direction terminology such as "up", "down", "forward", "backward", "front", "rear", "etc. is used with reference to the orientation of the figure or figures being described. Since components of examples can be positioned in a number of different orientations, the direction terminology is used only for illustration and is in no way restrictive. It is to be understood that other examples may be used and structural or logical modifications may be carried out, without departing from the protective scope of the appended claims. It is to be understood that the features of the various examples described herein may be combined with one another, unless specifically indicated otherwise. The following detailed description is therefore not to be interpreted in a restrictive sense, and the protective scope of this disclosure is defined by the appended claims.

In the scope of this description, terms such as "connected" and "coupled" are used to describe both direct and indirect connection, and direct or indirect coupling. In the figures, elements which are identical or similar are provided with identical references, insofar as this is expedient.

Figure 1:
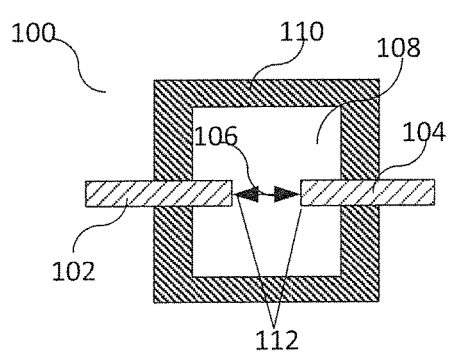
FIG. 1 shows a schematic arrangement of a discharge path according to various examples.

FIG. 1 shows a schematic arrangement of a discharge path 100, according to various examples.

A first electrically conductive section 102, which can be connected to a first electrode (not represented), and a second electrically conductive section 104, which can be connected to a second electrode (not represented), are schematically represented; a spacing 106 may be formed between the surfaces 112 of the electrically conductive sections 102, 104. In this spacing 106, a dielectric 108, can be formed between the electrically conductive sections, for example, a gas, for example, air; an electrically insulating, crosslinkable organic and/or inorganic compound, for example, an epoxy resin, a silicone or a ceramic, or even a vacuum. The dielectric 108 and parts of the electrically conductive sections 102, 104 may be enclosed by an encapsulation 110, in which case the encapsulation 110 may be optional or comprise the same material, or be formed therefrom, as the dielectric. The encapsulation 110 may partially or fully enclose the electrically conductive sections 102, 104; for example, the electrically conductive sections 102, 104 may be part of a cross section of a printed circuit board of an optoelectronic component device, in which case the encapsulation 110 may be further layers of the printed circuit board and a dielectric may be formed from air or an epoxide, for example, as a cavity in a layer plane of a the printed circuit board.

The encapsulation 110 may be formed as mechanical protection for the electrically conductive sections 102, 104 such that the spacing 106 between the surfaces 112 of the electrically conductive sections 102, 104 and the shape of the surfaces 112 of the electrically conductive sections 102, 104 are protected in respect of external actions of force, for example, a collision, impact, falling or bending, against changes, for example, an increase or decrease in the spacing 106 or a deformation of the surface 112 of the electrically conductive sections 102, 104.

In another configuration, the encapsulation 118 may be configured such that the dielectric 108, for example, air, is protected against environmental influences, for example, a change in the air humidity and/or an incidence of ionizing radiation, for example, UV radiation, X-radiation. These environmental influences could modify the necessary voltage, which should be applied via the electrically conductive sections 102, 104 such that formation of a spark discharge occurs at a value of the applied voltage which can be formed below the threshold voltage of the electronic component to be protected, or above the breakdown voltage of the electronic component to be protected.

Figure 2:
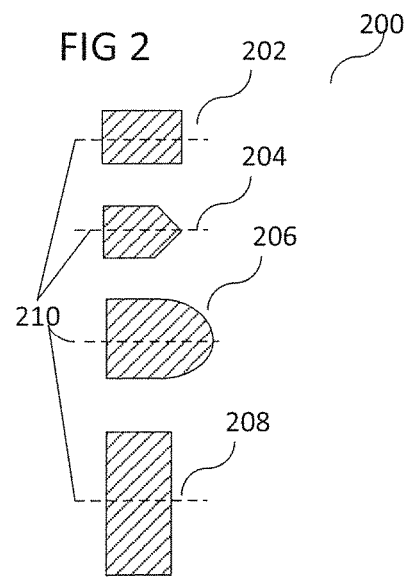
FIG. 2 shows different shapes of the surfaces of electrically conductive sections, between which a spark discharge can occur according to various examples.

FIG. 2 shows different shapes of the surfaces of electrically conductive sections, between which a spark discharge can occur according to various examples.

The section planes of different local and/or global geometrical configurations 200 of surfaces of electrically conductive sections, for example, from FIG. 1 the surfaces 112 of the first electrically conductive section 102 and/or of the second electrically conductive section 104, are represented schematically.

The geometrical shapes 202, 204, 206, 208 represented may, without restriction of generality, be surfaces of the electrically conductive sections 102, 104. The surfaces of the electrically conductive sections 102, 104, for example, between which the spark discharge can occur, may also locally and/or globally comprise combinations of the individual geometrical shapes 202, 204, 206, 208 with one another.

The geometrical shapes 202, 204, 206, 208 represented may regularly be configured such that they have a geometrical symmetry axis 210, in which case the symmetry axis 210 may have mirror symmetry 210 and/or additional rotational symmetry for the plane which is not represented, i.e. out of the plane of the drawing. In the case of mirror symmetry, the geometrical shape 202 may be formed as an edge, for example, of a thin metal sheet, while rotational symmetry of the shape 202 can lead to formation of a cylinder, for example, a rod or pin.

The electrically conductive sections, for example, 102, 104, may, for example, have a planar surface 202, 208 or a tapering surface 204, 206.

Electrically conductive sections 102, 104 with planar surfaces 202, 208 may, for example, be formed in a similar way to a rod 202 or pin 202, or in a similar way to a planar plane 208.

Electrically conductive sections 102, 104 with a tapering surfaces 204, 206 may, for example, be formed in a similar way to a point 204 or in a similar way to a rounding 206. By the tapering shape, the necessary voltage for the formation of the spark discharge can be reduced since the tapering surfaces 204, 206 can locally have a higher field strength than the planar surfaces 202, 208.

The surface may however also be partially or fully arbitrarily shaped, for example, by roughness or a coarse manufacturing process.

Figure 3:
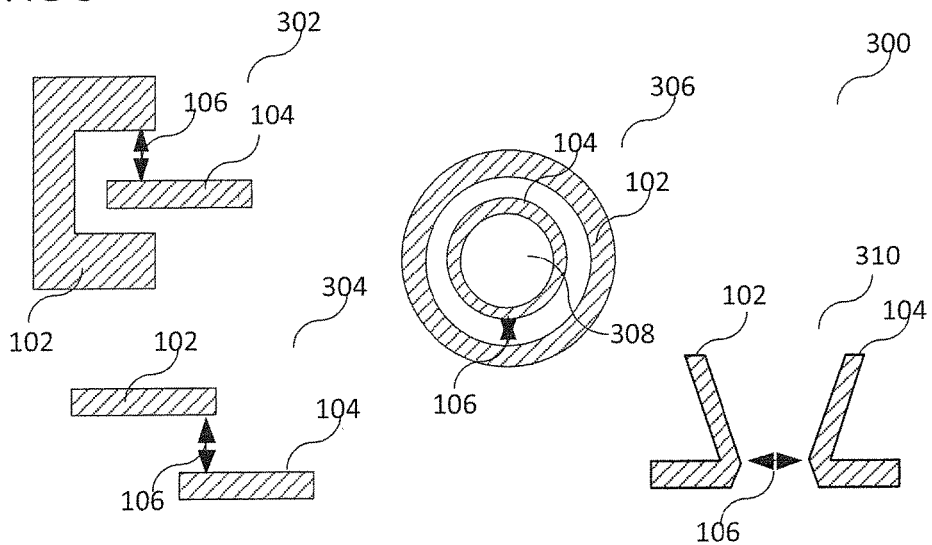
FIG. 3 shows arrangements of the electrically conductive sections with respect to one another according to various examples.

FIG. 3 shows arrangements 300 of the electrically conductive sections with respect to one another according to various examples.

Different arrangements 302, 304, 306, 310 of electrically conductive sections with respect to one another, for example, from FIG. 1 of the first electrically conductive section 102 relative to the second electrically conductive section 104, are schematically represented; the surfaces of the electrically conductive sections 102, 104, between which a spark discharge can occur, may have surface shapes according to the examples of FIG. 2.

The arrangements 302, 304, 306, 310 represented may, without restriction of generality, be understood as representative alternative examples to the arrangement of the electrically conductive sections 102, 104 of FIG. 1.

The arrangements 302, 304, 306, 308 may simultaneously be formed locally and/or globally on different regions of the electrically conductive sections 102, 104, i.e. they may also be combined with one another.

In one configuration, the electrically conductive sections 102, 104 may have a mutually complementary arrangement 302, in which case the first electrically conductive section 102 may be formed partially perpendicularly and/or parallel to the second electrically conductive section 104.

In one configuration, the electrically conductive sections may have an overlapping arrangement 304, i.e. an arrangement 304 offset with respect to one another and/or a displaced arrangement 304 of the electrically conductive sections 102, 104 with respect to one another, in which case parts of the electrically conductive sections may be mutually parallel, for example, at a spacing 106 from one another. The electrically conductive sections 102, 104 may also be formed in different planes in the sense of the plane of the drawing, for example, in a similar way to a cross.

In one configuration, a parallel arrangement of the electrically conductive sections 102, 104 may, for example, be formed as a partially and/or fully concentric arrangement 306 and/or coaxial arrangement 306 of the electrically conductive sections 102, 104, in which case the interior 308 of the second electrically conductive section 104 may, for example, be hollow or may, for example, comprise an electrically insulating material or may, for example, comprise the same material, a similar material or a different electrically conductive material than the second electrically conductive section 104.

In one configuration, the electrically conductive sections 102, 104 may have a diverging arrangement 310, for example, as a horn curve 310, or as a Jacob's ladder 310.

FIG. 4 shows an overview 400 of response voltages according to various examples.

Values for response voltages 404, 406, 408, 410, 412 of a discharge path with plane-parallel electrically conductive sections 102, 104 are represented, the spacing 106 of the electrically conductive sections 102, 104 being represented in the left-most column 402 in the overview 400.

The response voltages are indicated for different dielectrics 108 (columns from left to right): air 404, 406; plastic: polyphthalamide (PPA—premolded LED) 408, an epoxide 410 and a ceramic ($Al_2O_3$) 412.

The actual response voltage of the spark gap for a component device may be dependent on the specific configuration of the electrically conductive sections 102, 104 so that a voltage range within which a spark discharge can occur between the electrically conductive sections 102, 104 at a particular spacing 106, 402, for example, air in a voltage range between the minimum value 404 and the maximum value 406 for a particular spacing 106, 402, is often specified. For the other dielectrics 408, 410, 412 represented, the average response voltage 408, 410, 412 is indicated. It can be seen that, with a constant spacing 106, 402, the response voltage of the spark gap can be modified by the choice of the dielectric 108, 408, 410, 412.

The electrically conductive terminals should be configured such that the value of the response voltage of the discharge path is formed between the threshold voltage of the electronic component to be protected and the breakdown voltage of the electronic component. A typical value for a threshold voltage of an optoelectronic component, for example, a GaN diode may be formed from approximately 0 V to approximately 5 V. A typical breakdown voltage may, for such a component, be formed, for example, from approximately 170 V to approximately 200 V.

One configuration of the electrically conductive sections 102, 104 which satisfies these conditions may, for example, have a spacing 414 with a value of approximately 50 µm and a dielectric which comprises air or is formed therefrom. This configuration has the advantage that a spacing of 50 µm can be produced, or configured, simply in terms of process technology.

Figure 5:
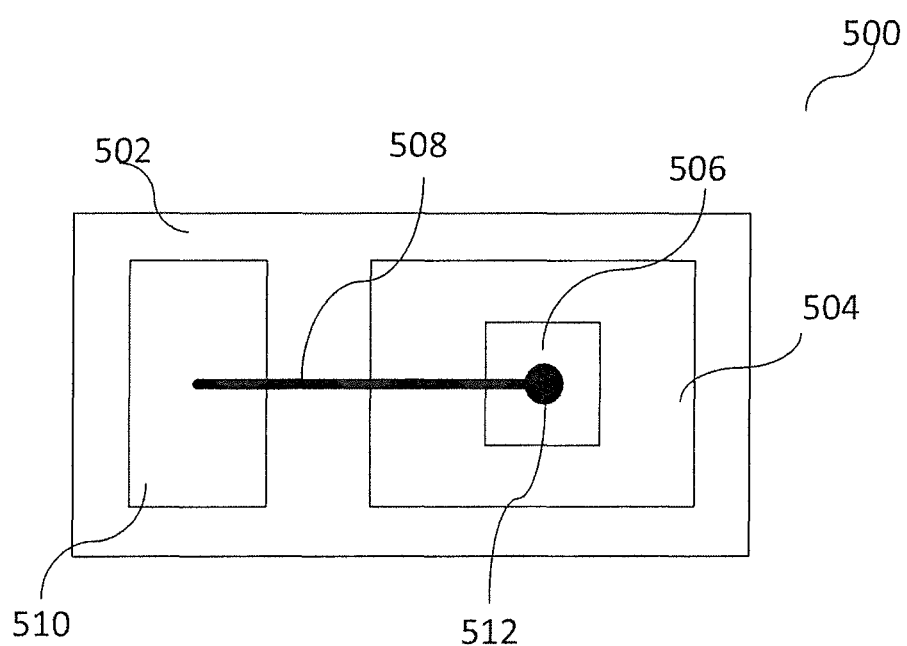
FIG. 5 shows a schematic representation of an optoelectronic component with a vertical electrical supply according to various application examples.

FIG. 5 shows a schematic representation of an optoelectronic component with a vertical electrical supply according to various examples.

Represented by way of example is a light-emitting diode 506, for example, an inorganic light-emitting diode 506, for example, a GaN diode 506 or an InGaN diode 506 which can be connected by an electrically conductive side, for example, the electrically conductive lower side of the light-emitting diode, to a first electrode 504 and is, for example, adhesively bonded by electrically conductive adhesive or is soldered. The diode 506 can be electrically connected by a conductive region 512, for example, a contact pad 512 on the upper side of the diode 506 by an electrical connection 508, for example, a wire bond to a second electrode 510. An electrical current can flow vertically through the diode 506, in other words: an electrical current can flow between the electrically conductive lower side of the diode (not represented) and the electrically conductive upper side of the diode 506. The vertical electrical supply of the diode 506 may be configured from the upper side of the diode 506 by a contact pad 512. An electrical connection to the first electrode 504 may be formed from the lower side of the diode 506 by electrically conductive tin solder or an adhesive.

In one configuration, the first electrode 504 and the second electrode 510 may, for example, be formed on an electrically nonconductive carrier 502.

In one configuration, the first electrode 504 and the second electrode 510 may be formed on an electrically conductive carrier 502, for example, a printed circuit board comprising electrically conductive regions, in which case the conductive regions may have a different electrical potential.

In one configuration, the first electrode 504 and the second electrode 510 may not have a common carrier 502. For example, the first electrode 504 and the second electrode 510 may be formed as separate electrodes 504, 540 and be fixed relative to one another by a package (not shown)—i.e. the carrier 502 may be optional.

The discharge path 100 may connect electrically in parallel with the component device 500.

Figure 6:
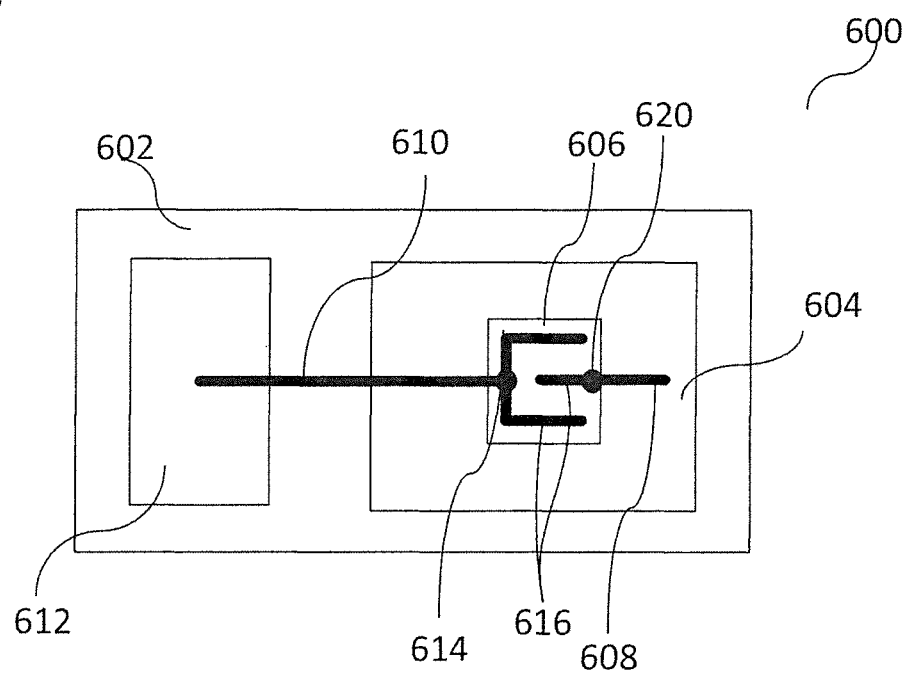
FIG. 6 shows a schematic representation of an optoelectronic component with a horizontal electrical supply according to various application examples.

FIG. 6 shows a schematic representation of an optoelectronic component with a horizontal electrical supply according to various application examples.

Represented by way of example is a chip 606 comprising a light-emitting diode 506, for example, a sapphire chip 606, the sapphire chip 606 having a horizontal electrical supply, in which case the electrical supply may be formed by a two-dimensional electrical supply configuration 616 or a current bifurcation 616. A part of the two-dimensional electrical supply configuration 616 may be electrically connected to a first electrical contact pad 620, in which case the first electrical contact pad 620 may be connected by an electrical connection 608, for example, a wire bond 608, to a first electrode 604. Another part of the two-dimensional electrical supply element 616 may electrically connect to a second electrical contact pad 614, in which case the second electrical contact pad 614 may connect by an electrical connection 610, for example, a wire bond 610, to a second electrode 612.

In one configuration, the first electrode 604 and the second electrode 612 may, for example, be formed on an electrically nonconductive carrier 602.

In one configuration, the first electrode 604 and the second electrode 612 may be formed on an electrically conductive carrier 602, for example, a printed circuit board comprising electrically conductive regions 604, 612, in which case the electrically conductive regions 604, 612 may have a different electrical potential to one another.

In one configuration, the first electrode 604 and the second electrode 612 may not have a common carrier 612. For example, the first electrode 604 and the second electrode 612 may be formed as separate electrodes 604, 612 and be fixed relative to one another by a package (not shown).

The discharge path 100 may be connected electrically in parallel with the component device 600.

Figure 7:
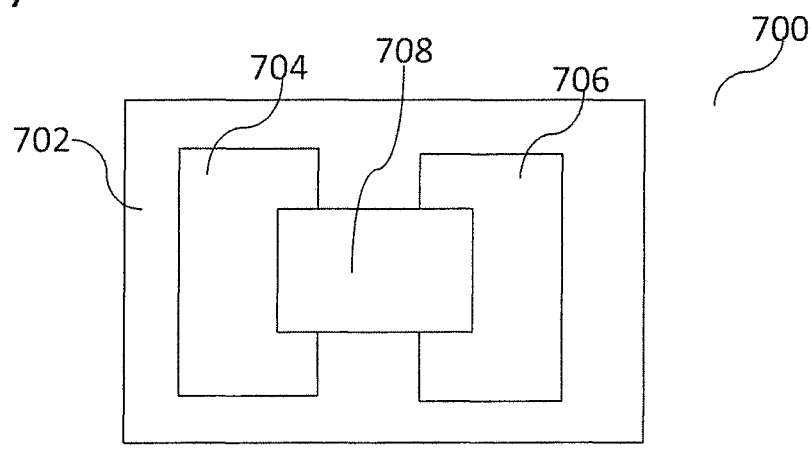
FIG. 7 shows a schematic representation of an optoelectronic component with a horizontal electrical supply according to various application examples.
Figure 7:
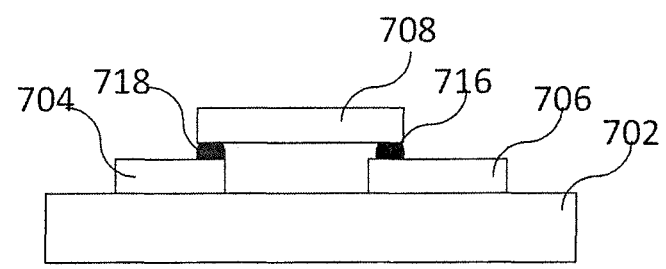

FIG. 7 shows a schematic representation of an optoelectronic component with a horizontal electrical supply according to various application examples.

Represented by way of example is a chip 708 comprising a light-emitting diode 506 (not represented), for example, a flip chip 708, the flip chip 708 having a horizontal electrical supply, in which case the electrical supply may be formed by contact pads on the lower side of the chip 708; a first electrical terminal 716, for example, a solder bead 716, may connect the chip 708 to a first electrode 706, and a second electrical terminal 718, for example, a solder bead 706, may electrically connect the chip 708 to a second electrode 704.

The chip 708 may furthermore comprise a two-dimensional electrical supply configuration (not represented) similar to the two-dimensional electrical supply configuration 616 from the description of FIG. 6.

In one configuration, the first electrode 706 and the second electrode 704 may, for example, be formed on an electrically nonconductive carrier 702.

In one configuration, the first electrode 706 and the second electrode 704 may be formed on an electrically conductive carrier 702, for example, a printed circuit board comprising electrically conductive regions, in which case the conductive regions may have a different electrical potential.

In one configuration, the first electrode 706 and the second electrode 704 may not have a common carrier 702. For example, the first electrode 706 and the second electrode 704 may be formed as separate electrodes 706, 704 and be fixed relative to one another by a package (not shown).

The discharge path 100 may connect electrically in parallel with the component device 700.

Figure 8:
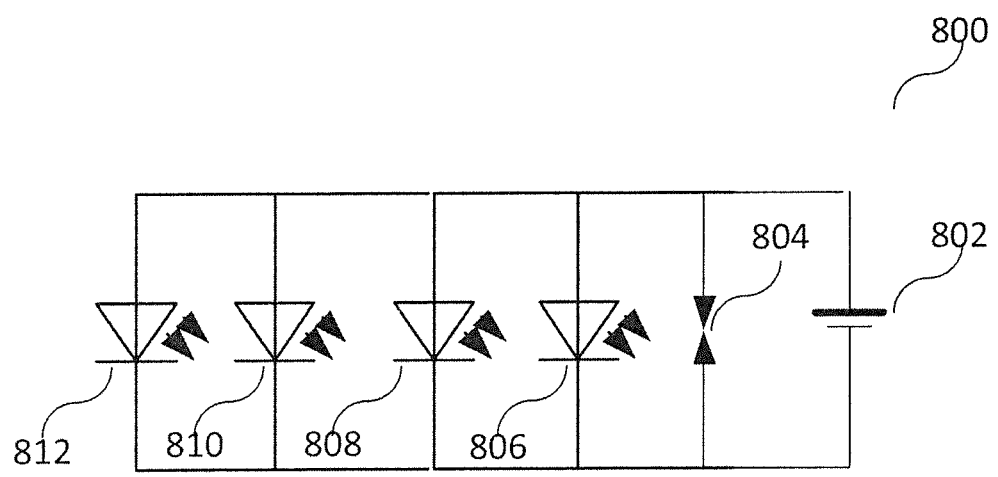
FIG. 8 shows a circuit diagram for a component, a "multi-die light engine", comprising a plurality of chips and producing light according to various application examples.

FIG. 8 shows a circuit diagram for a component, a "multi-die light engine", comprising a plurality of chips and producing light according to various application examples.

Represented is an electrical circuit diagram 800 in which more than one optoelectronic component, for example, two, three, four, five, six or more optoelectronic components 806, 808, 810, 812 can electrically connect in parallel with one another and supplied with electricity by a common voltage source 802. The first electrically conductive section with the second electrically conductive section may connect in parallel as a discharge path 804 with the voltage source 802 and the optoelectronic components 806, 808, 810, 812. In this way, more than one individual optoelectronic component can be protected simultaneously against electrostatic discharges by one discharge path 804.

Figure 9:
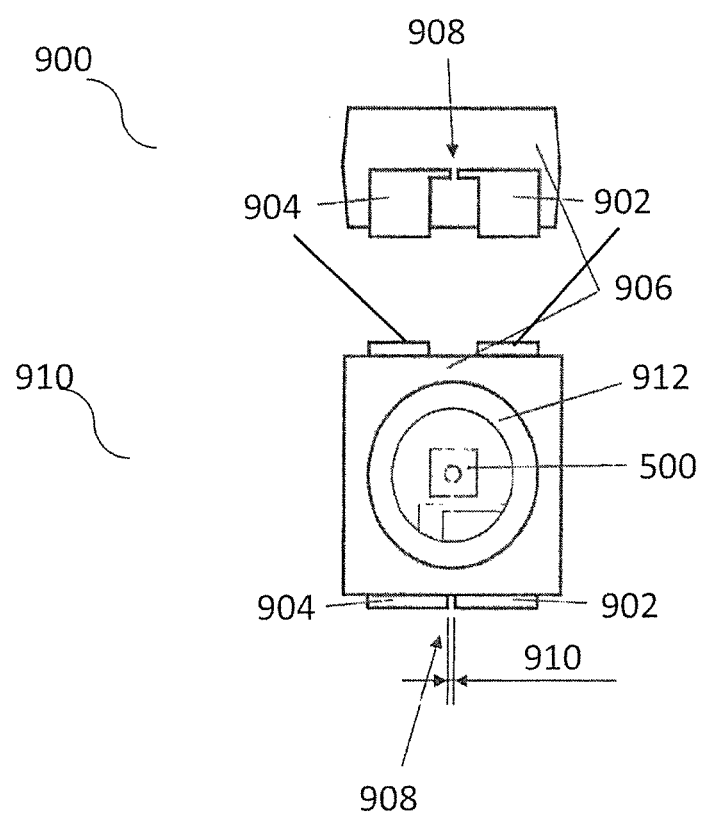
FIG. 9 shows an optoelectronic component having a discharge path according to various examples.

FIG. 9 shows an optoelectronic component having a discharge path according to various examples.

Represented is a side view 900 and a plan view 910 of an optoelectronic component according to one of the descriptions of FIG. 5, FIG. 6 and FIG. 7—without restriction of generality, a device 500 comprising a light-emitting diode 506 according to the description of FIG. 5 is represented.

The side view 900 shows a first electrode 904, a second electrode 902 and a discharge path 908, in which case the discharge path 908 may be formed outside a package 906, or a housing 906, as a part, in other words: from a region, of the first electrode 904 and of the second electrode 902. An electrical supply of the optoelectronic component may, for example, be formed by an electrical connection of the electrodes 904, 902 to an external voltage source (not represented).

The plan view 910 shows the package 906 has a reflector 912 cast in the package 906. The reflector may be filled with a transparent material, for example, an epoxide. Filling the reflector can improve the mechanical stability of the component device 900 and form mechanical protection for the optoelectronic component 506. The reflector 912 reflects the electromagnetic radiation emitted laterally by the optoelectronic component 506, which could otherwise be lost to the illumination owing to the spatial dimensions of the package 906.

On the other hand, by filling the reflector 912, direct contacting of the LED can no longer be possible. The electrodes 902, 904 may then be fed out from the package 906 and electrically coupled.

Also shown is the spacing 910 between the first electrically conductive section of the first electrode 904 and the second electrically conductive section of the second electrode 902, which may, for example, have a value of approximately 50 μm. Air as a dielectric may be formed in the region 908 between the electrically conductive sections. In this configuration, electrostatic charges can already flow away by spark formation between the electrically conductive sections 102, 104 from a voltage of from approximately 45 V to approximately 165 V.

If both electrodes are located on one component side, the electrically conductive sections 102, 104 may be formed by lengthening a region of the electrodes 904, 902 in the vicinity of the housing 906.

The shape of the electrically conductive sections 102, 104 should in this case be formed as acutely tapering as possible to form a response voltage in the lower voltage range 404 for a given spacing 106 of the electrically conductive sections 102, 104.

Figure 10:
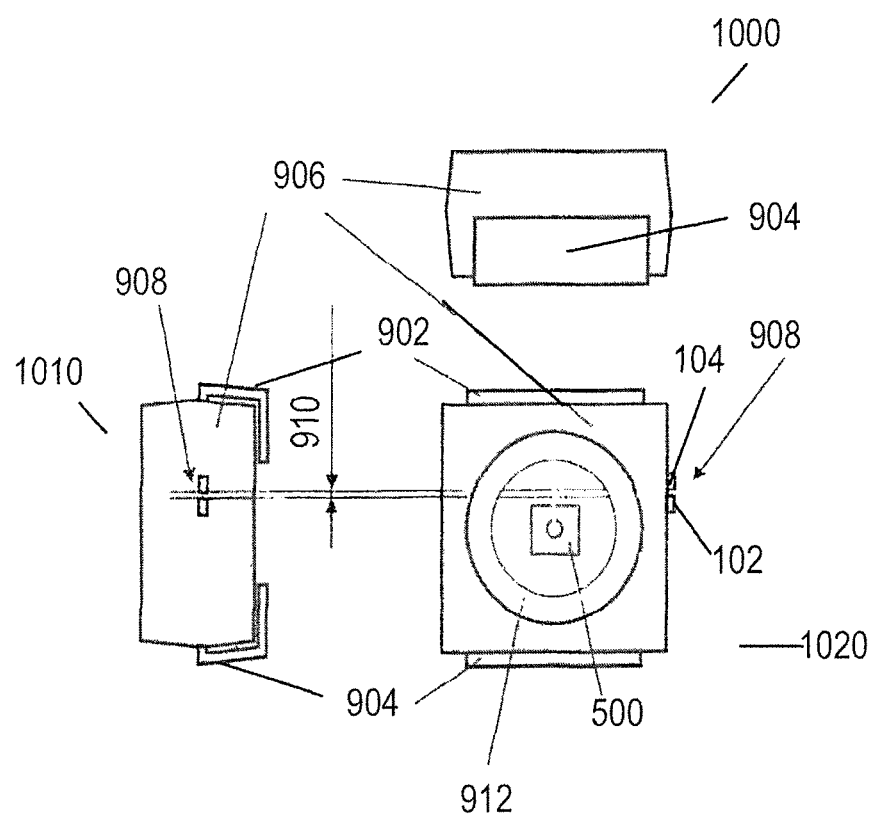
FIG. 10 shows an optoelectronic component having a discharge path according to various examples.

FIG. 10 shows an optoelectronic component having a discharge path according to various examples.

An optoelectronic component according to one of the descriptions of FIGS. 5, 6 and 7 is represented in two side views 1000, 1010 and a plan view 1020—without restriction of generality, a device 500 comprising a light-emitting diode according to the description of FIG. 5 is represented.

One side view 1000 shows a first electrode 904 and a package 906. The first electrode 904 may in this case be formed to electrically supply the optoelectronic component 500 inside the package 906 and, for example, electrically coupled to an external voltage source (not shown).

Another side view 1010 shows the first electrode 904 and a second electrode 902, as well as a discharge path 908 outside the package 906. The electrically conductive sections 102, 104 may have a spacing 910 between them which has a value of approximately 50 μm, and air as a dielectric 108 may be formed between the electrically conductive section.

The plan view 1020 represents, in a similar way to the description of FIG. 9, a package 906 comprising a cast reflector 912, an optoelectronic component, for example, the component device 500 comprising an LED, the first electrode 904 and the second electrode 902.

It can furthermore be seen that the discharge path 908 may be formed by the electrically conductive sections 102, 104 through the package 906 and outside the package 906. In this way, the dielectric 108 may, for example, comprise air. Furthermore, ozone possibly formed by electrostatic discharges across the discharge path 908 can be kept away from sensitive layers in the vicinity of the optoelectronic component. It can furthermore be seen from the plan view 1020 that the electrically conductive sections can be formed independently of the shape and position of the electrodes 904, 902 since the electrically conductive sections are not formed as parts or regions of the electrodes.

The shape of the electrically conductive sections 102, 104 should in this case be formed as acutely tapering as possible to form a response voltage in the lower voltage range 404 for a given spacing 106 of the electrically conductive sections 102, 104.

Figure 11:
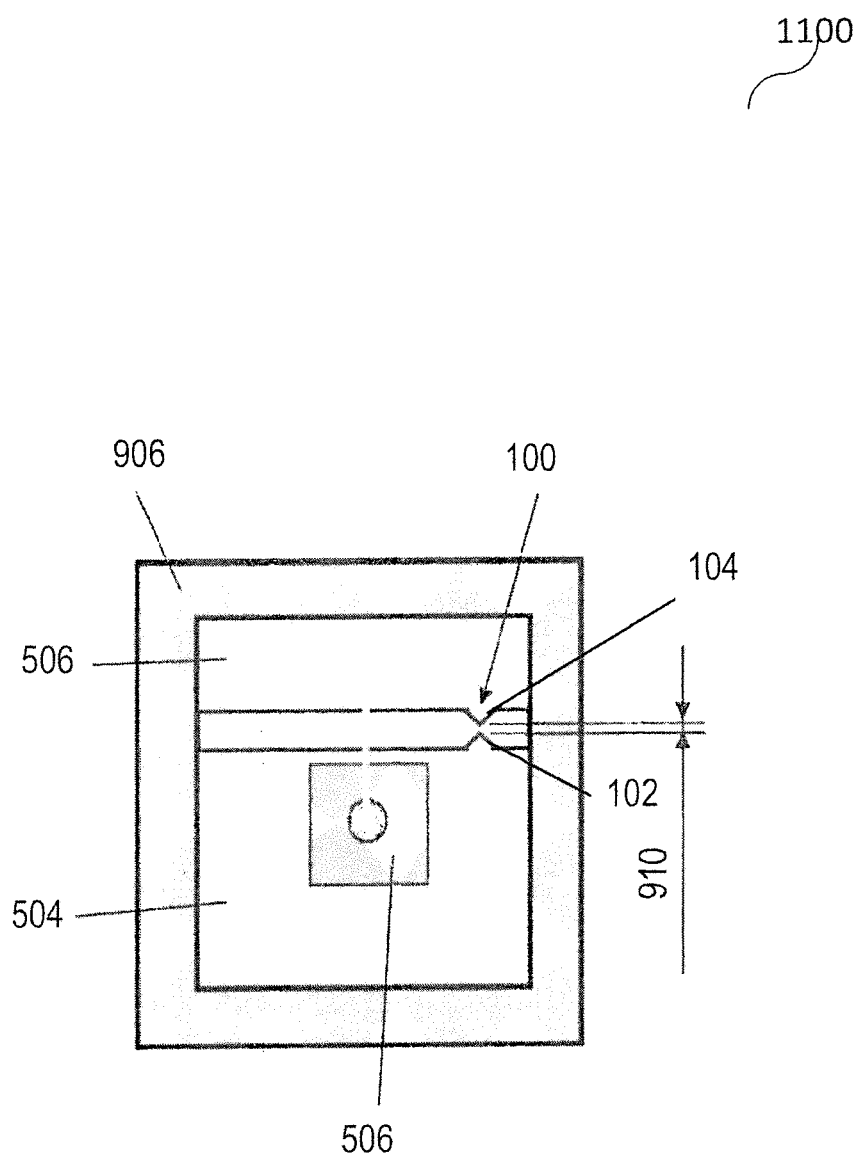
FIG. 11 shows an optoelectronic component having a discharge path according to various examples.

FIG. 11 shows an optoelectronic component having a spark gap according to various examples.

Represented in a plan view 1100 is an optoelectronic component according to one of the descriptions of FIGS. 5, 6 and 7—without restriction of generality, a device 500 comprising a light-emitting diode 506 according to the description of FIG. 5 is represented.

A device 500 according to the description of FIG. 5 is shown, the first electrode 504 and the second electrode 510 not having a common carrier 502. Fastening of the first electrode 502 to the second electrode 510 may be formed by the package 906. The first electrode 502 and the second electrode 510 may in the separated state also be regarded as a lead frame.

Spatially and electrically in parallel with the device 500, according to the description of FIG. 5, inside the package 906 the first electrode 504 may comprise a first electrically conductive section 102 and the second electrode 506 may comprise a second electrically conductive section 104. The electrically conductive sections 102, 104 may, for example, have a shape 204 tapering to a point. The electrically conductive sections 102, 104 may, however, also be formed, for example, as in the configurations of the description of FIG. 2 and in the configurations of the descriptions of FIG. 3.

The spacing of the electrically conductive sections 102, 104 may, depending on the selected dielectric, for example, air, have a value of approximately 50 μm. The parallel connection of the electrically conductive sections 102, 104 can protect the optoelectronic component 506 against electrostatic discharges in the reverse-bias direction in relation to the optoelectronic component 506.

This design 1100 may, for example, be formed when the package 906 is not intended to be cast with an epoxy resin or silicone, for example, when a window i.e. solid transparent mechanical protection, is applied on or over the optoelectronic component device 1100 represented.

FIGS. 9, 10 and 11 therefore show optoelectronic component devices 900, 1010, 1100 in different variants. Each of the optoelectronic component devices 900, 1010, 1100 comprises a package 906, which may also be referred to as a housing, and a light-emitting diode 506 or another optoelectronic semiconductor chip. The package 906 may respectively comprise an electrically insulating material, for instance a plastic material.

For each optoelectronic component device 900, 1010, 1100, the package 906 comprises a first electrode 904 and a second electrode 902, which serve as electrical terminals of the respective optoelectronic component device 900, 1010, 1100.

The electrodes 904, 902 of the package 906 of the optoelectronic component devices 900, 1010, 1100 are always at least partially embedded in the material of the package 906. The electrodes 904, 902 may, for example, be formed as lead frame sections, which are embedded in a plastic material of the package. Embedding of the electrodes 904, 902 in the material of the package 906 may, for example, be carried out by an injection-compression process, an injection molding process or another molding process. The electrodes 904, 902 of the optoelectronic component devices 900, 1010, 1100 then respectively comprise sections which extend inside the package 906, as well as sections which extend outside the package 906.

The electrodes 904, 902 of the optoelectronic component devices 900, 1010, 1100 each preferably comprise and is not covered by the material of the package 906, which are used for electrical contacting of the respective electronic component devices 900, 1010, 1100. For example, the optoelectronic component devices 900, 1010, 1100 may be formed as surface-mountable component devices (SMD component devices) suitable for surface mounting, for example, for surface mounting by reflow soldering.

The light-emitting diode 506 of each optoelectronic component device 900, 1010, 1100 comprises two electrical terminal surfaces, which are electrically conductively connected to the electrodes 904, 902 of the respective optoelectronic component device 900, 1010, 1100. The electrical terminal surfaces of the light-emitting diode 506 may be arranged both on the same side of the light-emitting diode 506, i.e., for example, on the upper side of the light-emitting diode 506 or on the lower side of the light-emitting diode 506, or on different sides of the light-emitting diode 506. The electrically conductive connections between the terminal surfaces of the light-emitting diode 506 and the electrodes 904, 902 of the respective optoelectronic component device 900, 1010, 1100 may, for example, be formed as represented in one of FIGS. 5, 6 and 7. The electrically conductive connections may respectively be produced for example by a solder, an electrically conductive adhesive or by bonding wires.

For each of the optoelectronic component devices 900, 1010, 1100, the electrodes 904, 902 comprise sections on which the electrodes 904, 902 are brought so close together that a potential discharge path 908 is formed. These sections of the electrodes 904, 902 correspond to the sections 102, 104 of the schematic representations of FIGS. 1 and 3. In these sections, the electrodes 904, 902 of the optoelectronic component devices 900, 1010, 1100, respectively, have a spacing 910 which corresponds to the spacing 106 of FIGS. 1 and 3 and is so small that the potential discharge path 908 is formed. The spacing 910 may, for example, be approximately 50 μm.

The sections, forming the discharge path 908, of the electrodes 904, 902 of the optoelectronic component devices 900, 1010, 1100 are, respectively, formed by sections not covered by the material of the package 906 or by another material, of the electrodes 904, 902. Air as a dielectric is preferably arranged in the region of the spacing 910 forming the discharge path 908 between the electrodes 904, 902.

For the optoelectronic component device 900 of FIG. 9, the discharge path 908 is formed between sections of the electrodes 904, 902 which are arranged next to the sections of the electrodes 904, 902 used for the electrical contacting of the optoelectronic component device 900 and on an outer side of the package 906. For the optoelectronic component device 1010 of FIG. 10, the discharge path 908 is formed by sections of the electrodes 904, 902 specially fed out of the material of the package 906 of the optoelectronic component device 1010 for this purpose and are arranged on an outer side of the package 906. For the optoelectronic component device 1100 of FIG. 11, the discharge path 908 is formed by sections of the electrodes 904, 902 which are also used for the electrical contacting of the light-emitting diode 506 and are arranged in an inner region of the package 906, in which the light-emitting diode 506 is also arranged.

For the optoelectronic component devices 900, 1010, 1100, the discharge path 908 formed between the electrodes 904, 902 is electrically connected in parallel with the light-emitting diode 506.

In various examples, an optoelectronic component device and a method of producing an optoelectronic component device are provided, the component device saving on the costs and the area for an additional ESD protection diode. At the same time, reliable ESD protection can be ensured for potential differences of more than 2 kV, without the possibility that the LED chip will be damaged.

The invention claimed is:

1. An optoelectronic component device comprising:
a first electrode and a second electrode, wherein the first electrode and the second electrode serve as electrical terminals of the optoelectronic component device;
a first optoelectronic component electrically coupled to the first electrode and the second electrode; and
a first electrically conductive section formed as a region of the first electrode, and a second electrically conductive section formed as a region of the second electrode;
wherein the first electrically conductive section and the second electrically conductive section are arranged electrically in parallel with the first optoelectronic component;
wherein the first electrically conductive section and the second electrically conductive section are arranged and configured relative to one another such that, beyond a response voltage applied over the first conductive section and the second conductive section, a spark discharge occurs between the first conductive section and the second conductive section;
wherein the response voltage has as its value a value formed greater than a threshold voltage value of the first optoelectronic component and less than or equal to the value of a breakdown voltage of the first optoelectronic component;
wherein the optoelectronic component is enclosed by a package;
wherein the spark discharge occurs on an outer side of the package;
wherein the optoelectronic component is formed on or over a lead frame, and wherein the first electrically conductive section or the second electrically conductive section is formed as part of the lead frame.

2. The optoelectronic component device as claimed in claim 1, wherein the first electrode comprises a different material than the second electrode.

3. The optoelectronic component device as claimed in claim 1, wherein the optoelectronic component is configured as an electromagnetic radiation-emitting component.

4. The optoelectronic component device as claimed in claim 1, wherein the shortest distance between the first electrically conductive section and the second electrically conductive section, between which the spark discharge is formed, has a value of approximately 1 μm to approximately 10 μm.

5. The optoelectronic component device as claimed in claim 1, wherein the optoelectronic component device is configured such that the optoelectronic component is protected against electrostatic discharges in the reverse-bias direction.

* * * * *